(12) United States Patent
Smith

(10) Patent No.: US 6,538,313 B1
(45) Date of Patent: Mar. 25, 2003

(54) IC PACKAGE WITH INTEGRAL SUBSTRATE CAPACITOR

(75) Inventor: Joseph O. Smith, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/993,440

(22) Filed: Nov. 13, 2001

(51) Int. Cl.[7] ............................................. H01L 23/06
(52) U.S. Cl. ...................... 257/684; 257/528; 257/532; 257/724; 257/686; 257/701; 257/707; 257/693; 257/690; 257/678
(58) Field of Search .................... 257/528, 532, 257/684, 796, 723, 724, 686, 700, 701, 707, 712, 698, 693, 690, 678

(56) References Cited

U.S. PATENT DOCUMENTS

| | | | |
|---|---|---|---|
| 5,498,901 A | | 3/1996 | Chillara et al. |
| 5,629,559 A | | 5/1997 | Miyahara |
| 5,895,966 A | * | 4/1999 | Penchuk .................... 257/665 |
| 6,362,964 B1 | * | 3/2000 | Dubhashi et al. ........... 257/724 |
| 6,091,144 A | | 7/2000 | Harada |
| 6,127,724 A | * | 10/2000 | DiStefano .................. 257/675 |
| 6,222,260 B1 | * | 4/2001 | Liang et al. ................ 257/666 |
| 6,310,388 B1 | * | 10/2001 | Bissey ....................... 257/532 |
| 6,342,724 B1 | * | 1/2002 | Wark et al. ................. 257/532 |
| 6,388,207 B1 | * | 5/2002 | Figueroa et al. ............ 174/261 |
| 6,395,578 B1 | * | 5/2002 | Shin et al. .................. 438/106 |
| 2002/0015292 A1 | * | 2/2002 | Pritchett et al. ............ 361/780 |
| 2002/0027763 A1 | * | 3/2002 | Schaper .................... 361/306.2 |

* cited by examiner

Primary Examiner—Nathan J. Flynn
Assistant Examiner—Pershelle Greene
(74) Attorney, Agent, or Firm—Beyer Weaver & Thomas, LLP

(57) ABSTRACT

An integrated circuit package is described that includes a capacitor structure having a pair of plates separated by a dielectric material. An integrated circuit (IC) die is carried by a top surface of the first capacitor plate. The die carried by the capacitor structure is electrically connected to a multiplicity of contacts. A protective encapsulant covers the die and a portion of the capacitor structure while leaving a surface of the second capacitor plate at least partially exposed. In some embodiments, one of the capacitor plates (typically the lower capacitor plate) is formed from the same lead frame sheet as the contacts. In LLP implementations, the lower capacitor plate is substantially co-planar with the contacts. Depending on the implementation the capacitor structure can be electrical connected in a variety of different manners. One or both of the plates can be electrically connected to either (or both of) selected bond pads on the die or selected leads or contacts.

10 Claims, 7 Drawing Sheets

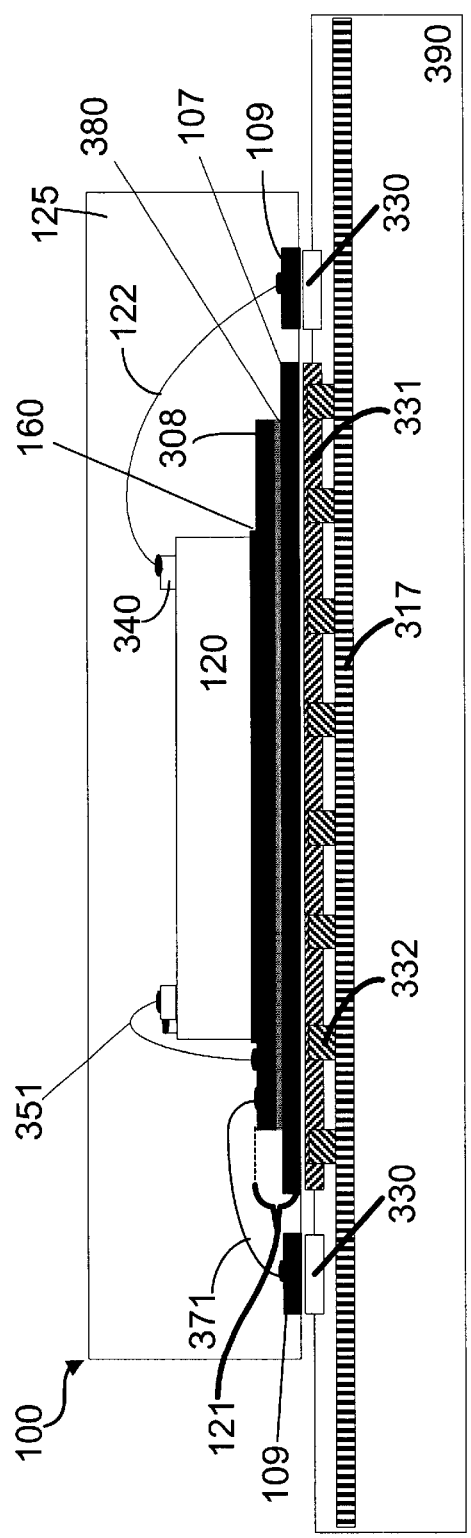
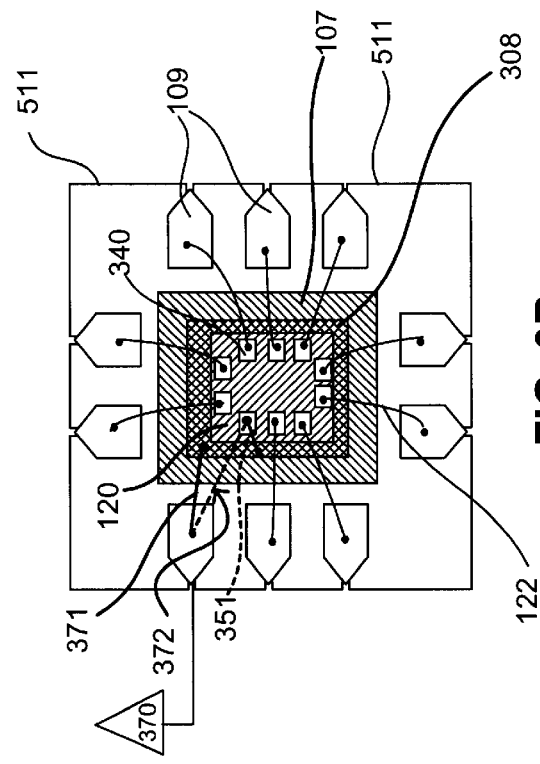
FIG. 3A
FIG. 3B

IC PACKAGE WITH INTEGRAL SUBSTRATE CAPACITOR

FIELD OF THE INVENTION

The present invention relates generally to integrated circuit (IC) packages. More particularly, the invention relates to IC packages with embedded capacitive components.

BACKGROUND OF THE INVENTION

In many types of circuits, it is desirable to provide discrete components such as capacitors and inductors in combination with integrated circuits. In some circumstances, efforts have been made to incorporate a discrete component, such as a capacitor, into the package that protects the integrated circuit. By way of example, U.S. Pat. No. 6,091,144 describes a package which has a capacitor structure formed on a die pad. Other packages with integrated capacitor structures include U.S. Pat. Nos. 5,498,901 and 5,629,559. These capacitors are typically used to reduce power supply noise delivered to the integrated circuit. Although such structures likely work well, there are continuing efforts to improve the manufacturability of the packages and to improve their electrical performance.

One relatively recently developed package is a leadless leadframe style package (LLP). A LLP is a type of surface mounted integrated circuit package that uses a metal (typically copper) leadframe substrate to form a chip scale package (CSP). As illustrated in FIGS. 1a, b, and c, in known leadless leadframe packages, a copper leadframe strip or panel 101 is patterned, typically by stamping or etching, to define a plurality of arrays 103 of device areas 105. Each device area 105 includes a die attach pad 107 and a plurality of contacts 109 disposed about associated die attach pad 107. Very fine tie bars 111 are used to support the die attach pads 107 and contacts 109 during manufacturing.

During assembly, IC dice are attached to respective die attach pads 107 and conventional wire bonding is used to electrically couple bond pads on each die to associated contacts 109 within the same device area 105. After the wire bonding, a plastic cap is molded over the top surface of each device area 105 or over the entire array 103. The capped dice are then cut from the array and tested using known sawing and testing techniques.

FIG. 2 provides a cross-section of a known LLP. Die attach pad 107 supports die 120, often attached by a non-conductive resin 160. Die 120 is electrically connected to its associated contacts 109 by bonding wires 122. A molded plastic cap 125 encapsulates die 120 and bonding wires 122 and fills the gaps between die attach pad 107 and contacts 109, holding the contacts in place. During singulation, tie bars 111 are cut. The resulting packaged chip can then be surface mounted on a printed circuit board (PCB) or other substrate using known techniques. Since LLPs are growing in popularity, it would be desirable to provide simple techniques for integrating capacitor structures into such packages. It would also be desirable if the improved techniques are also applicable to some other package designs.

SUMMARY OF THE INVENTION

To achieve the foregoing and other objects of the invention, an integrated circuit package is described that includes a capacitor structure having a pair of plates separated by a dielectric material. An integrated circuit (IC) die is carried by a top surface of the first capacitor plate. The die carried by the capacitor structure is electrically connected to a multiplicity of contacts. A protective encapsulant covers the die and a portion of the capacitor structure while leaving a surface of the second capacitor plate at least partially exposed.

In some embodiments, one of the capacitor plates (typically the lower capacitor plate) is formed from the same lead frame sheet as the contacts. In LLP implementations, the lower capacitor plate is substantially co-planar with the contacts. Depending on the implementation the capacitor structure can be electrically connected in a variety of different manners. One or both of the plates can be electrically connected to either (or both of) selected bond pads on the die or selected leads or contacts.

Other features, advantages, and objects of the present invention will become more apparent and be more readily understood from the following detailed description, which should be read in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 3a and 3b depict, respectively, a cross-section and top view of a first embodiment of the present invention wherein the package lead contacts are coplanar with an exposed capacitor forming plate;

DETAILED DESCRIPTION OF THE PREFERRED EMBODIMENTS

Figure 1A:
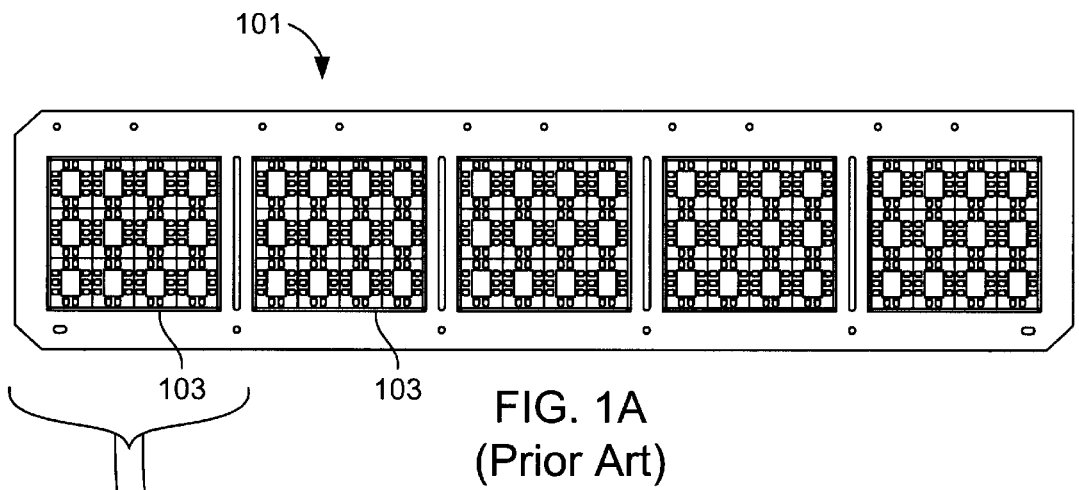
FIG. 1a is a diagrammatic top view of a known lead frame strip suitable for use in forming LLPs, with FIGS. 1b and 1c showing successively more detailed views of the elements in the strip.

One of the goals of the present invention is to provide an inexpensive structural capacitor that can be incorporated into an integrated circuit (IC) package. FIG. 3a illustrates a side cross-section of a first embodiment of the present invention, and FIG. 3b the respective top view of the first embodiment. Referring to FIG. 3a, in the first described embodiment, a capacitor 121 is formed in a leadless leadframe style package (LLP) 100 that is mounted on a printed circuit board (PCB) 390. Capacitor 121 is formed by sandwiching a dielectric material 380 between a die attach plate 308 and a substrate plate 107. Die attach plate 308 can optionally be made slightly smaller than substrate plate 107 such that down-bonding to the top surface of substrate plate 107 is possible. Substrate plate 107 has a bottom surface that is exposed outside the package, and is available for electrical connection directly to the PCB. As will be appreciated by those familiar with capacitor design, the capacitance of the capacitor structure can be designed to a desired value within a relatively broad range by varying such factors as the distance between the plates, the choice and thickness of the dielectric material, and the size and/or configuration of the plates.

A wide variety of materials can be used to form dielectric film 380; for example, adhesive tapes such as polyimide or epoxy resins can be used. Known dielectrics provide the desired characteristics of good thermal conductivity, uniform thickness, and rigid adherence to plates 107 and 308. An IC die 120 may be secured directly or indirectly to die attachment plate 308 using any suitable die attachment technique. By way of example, a wide variety of suitable die attachment adhesives 160 may be used to secure the die 120 to the attachment plate 308. One suitable adhesive is an electrically non-conductive epoxy resin. Alternatively, if desirable for a particular application (such as when a contact is formed on the back surface of the die), an electrically conductive adhesive or solder could be used. Substrate plate 107 and coplanar contacts 109 are suitable for surface mounting on the PCB 390. When mounting the package 100, PCB pads 330 are electrically bonded to IC package contacts 109 thereby electrically connecting PCB circuits to associated contacts 109. The contacts 109, in turn are electrically connected to die terminals (bond pads) 340 on the die 120 and/or one of the capacitor plates by conventional techniques such as wire bonding using bonding wires 122.

The substrate plate 107 is physically attached and electrically connected to PCB substrate pad 331 by conventional techniques such as soldering or adhesive bonding with an electrically conductive adhesive. When the package's substrate plate 107 is intended to be grounded, the PCB substrate pad 331 is electrically (and thermally) connected to the PCB's ground plane 317 using conventional PCB techniques. For example, when the PCB is a multi-layered printed circuit board, PCB vias 332 may be provided to electrically connect the substrate pad to the ground plane 317. With this arrangement, vias 332 dissipate heat into ground plane 317. In alternative embodiments where the package's substrate plate 107 is intended to have an electrical potential, the substrate pad 331 may be electrically connected to a power plane.

System designers may improve the LLP's electrical and thermal performance by increasing the number of vias 332 to decrease the thermal resistance and electrical impedance path between substrate plate 107 to the PCB power or ground plane 317. For example, in current designs, each via 332 typically has only about 0.7 nH of inductance. Thus, a large number of via 332 connections acting in parallel, can reduce the effective impedance to the power or ground plane 317 to negligible levels. This multitude of contacts additionally provides for a beneficial increase in the thermal dissipation from die 120 into PCB 390. By way of example, in this LLP embodiment of the present invention, vertical thermal conductance $J_C$ is roughly 1.6° C./W, as compared to about 1° C./W in prior-art. A potentially more significant contributor to thermal resistance is capacitor dielectric 380. It should be appropriately chosen by the designer to include thermal conductance properties necessary to meet the required $J_C$ for the application. Alternatively, instead of attaching part of the exposed surface of substrate plate 107 to solid PCB substrate pad 331, the system designer may choose to eliminate substrate pad 331, and directly attach the exposed surface of substrate plate 107 to grounded vias 332 that protrude through the PCB surface. It should be appreciated that this could significantly decrease electrical and thermal performance. This alternative implementation may be desired if the decreased electrical and thermal performance is acceptable, and the area below substrate plate 107 is needed for routing PCB traces.

The discrete capacitor 121 can be used in many different ways including functioning as a power supply filter, or as a capacitor available for use by circuits internal (or possibly even external) to IC package 100. Because capacitor 121 is very close to die 120, it has significantly lower parasitic components than does an externally placed capacitor. When used as a power supply filter, the lower parasitic components of capacitor 121 enables it to better reduce power supply noise than do capacitors placed further away from the die. Additionally, if circuits in die 120 require a capacitor that is too large to form in the die, system designers can significantly improve performance and reduce cost by connecting capacitor 121 to circuits in die 120.

Still referring to FIG. 3a, a cross-sectional view of the connections to capacitor 121 is shown. The die attach plate 308, which also is the upper capacitor plate, can be connected to die terminals 340 by suitable techniques such as down-bonding with bond wire 351. This plate can also be connected to IC package contact 109 by bond wire 371 for external PCB connection.

A top view of FIG. 3a is illustrated in FIG. 3b. In this application, the plates of capacitor 121 are coupled to opposite power supply polarities to reduce noise in power supplied to die 120. By way of example, die attach plate 308 is charged to positive supply potential 370 via bond wire 371, and substrate plate 107 is grounded through the PCB substrate pad (shown in FIG. 3a). Alternatively, the polarities of capacitor plates 308 and 107 could be reversed. The power connection to die 120 is completed by wire 351 from die attach plate 308 to die terminal 340. Thus, a power connection from die 120 to external power source 370 is made. Usually, the current practice is to make an IC power supply connection by bonding wire 372 directly from die terminal 340 to the corresponding IC package contact 109. This practice can result in longer bond wire connections than if the capacitor plate is used as an intermediate path. It should be appreciated that the effective bond wire parasitic length of traditional power connection 372, made from the die to the IC package contact, can be reduced because die attach plate 308 has less impedance than a bond wire. Moreover, a parallel multiplicity of connections to die attach plate 308, either from IC contacts 109 or from the die terminals 340, can further decrease power supply parasitic components.

Figure 4:
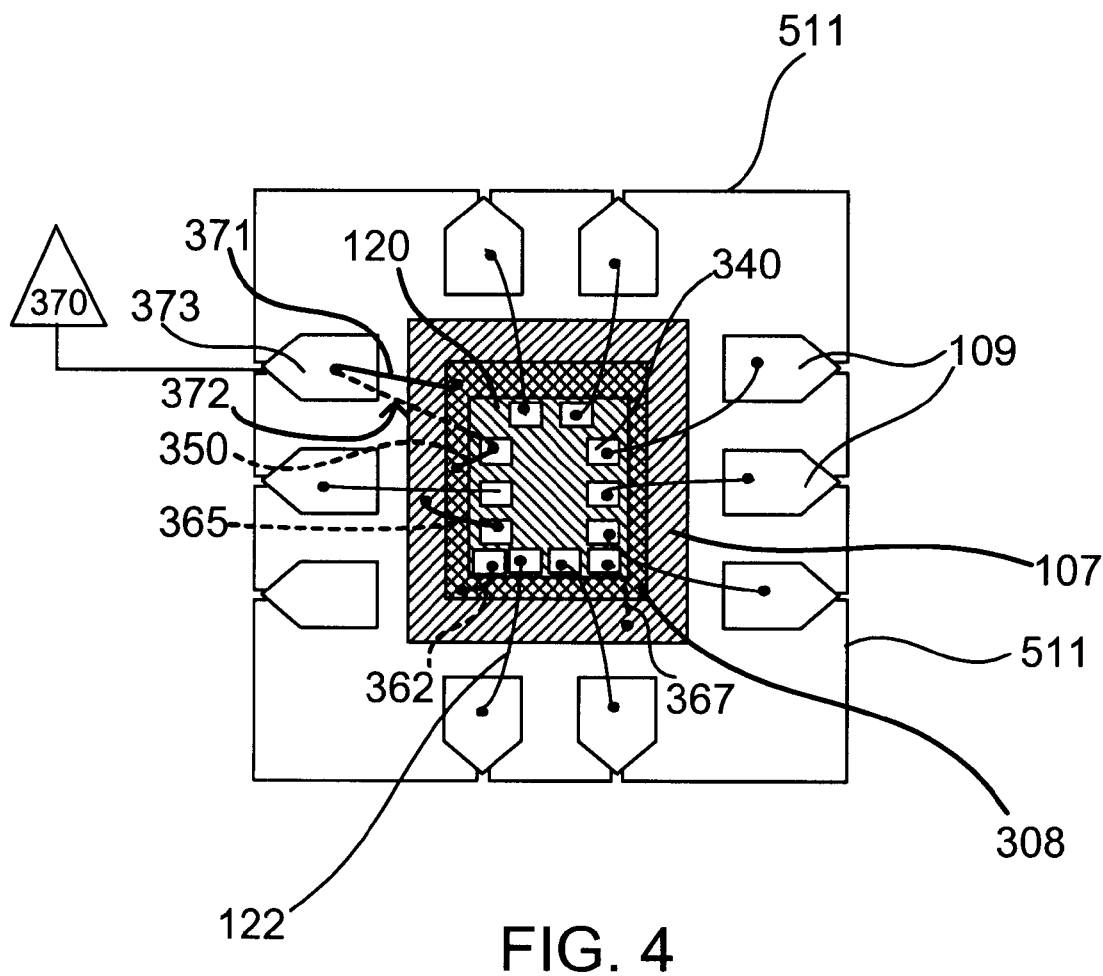
FIG. 4 is a top view of a second embodiment of the present invention with alternative connections that use the capacitor plates as an internal power bus.

In a second embodiment, illustrated in FIG. 4, substrate plate 107 or die attach plate 308 provide a low impedance PCB power supply or ground connection to die 120 by down-bonding bond wires 350 and 365 from die 120 to die attach plate 308 and substrate plate 107, respectively. In this mode, in addition to filtering power supply noise, both die attach plate 308 and substrate plate 107 act as an internal power bus for die 120. In this embodiment, bond wire parasitic components are significantly reduced in two ways. First, the down-bonded bond wire length is shorter than the wire that must be connected to package contacts 109 for power; resulting in reduced electrical impedance to the ground or power plane 317. In current technology, the longer bond wires 372 that connect directly from the die terminal 340 to package power contact 373 have about 3 nH of inductance, and down-bonded bond wires, such as 365 and 350, only about 1 nH; a one third reduction in overall parasitic impedance. Second, to get power to die 120 a multiplicity of additional die-to-plate down-bonded connections, such as 362 or 367, are possible without requiring additional package power contacts 373. In this case, the effective package parasitic component is equal to the individual down-bonded bond wire impedance values taken in parallel. For example, if bond wires 365 and 367 were both down-bonded from die terminal 340 to substrate plate 107, their effective impedance to ground would be reduced by one half. In many current implementations, each connection between die bond pad 340 to a power source requires a separate package power contact 373 that is connected externally to power source 370.

Figure 5:
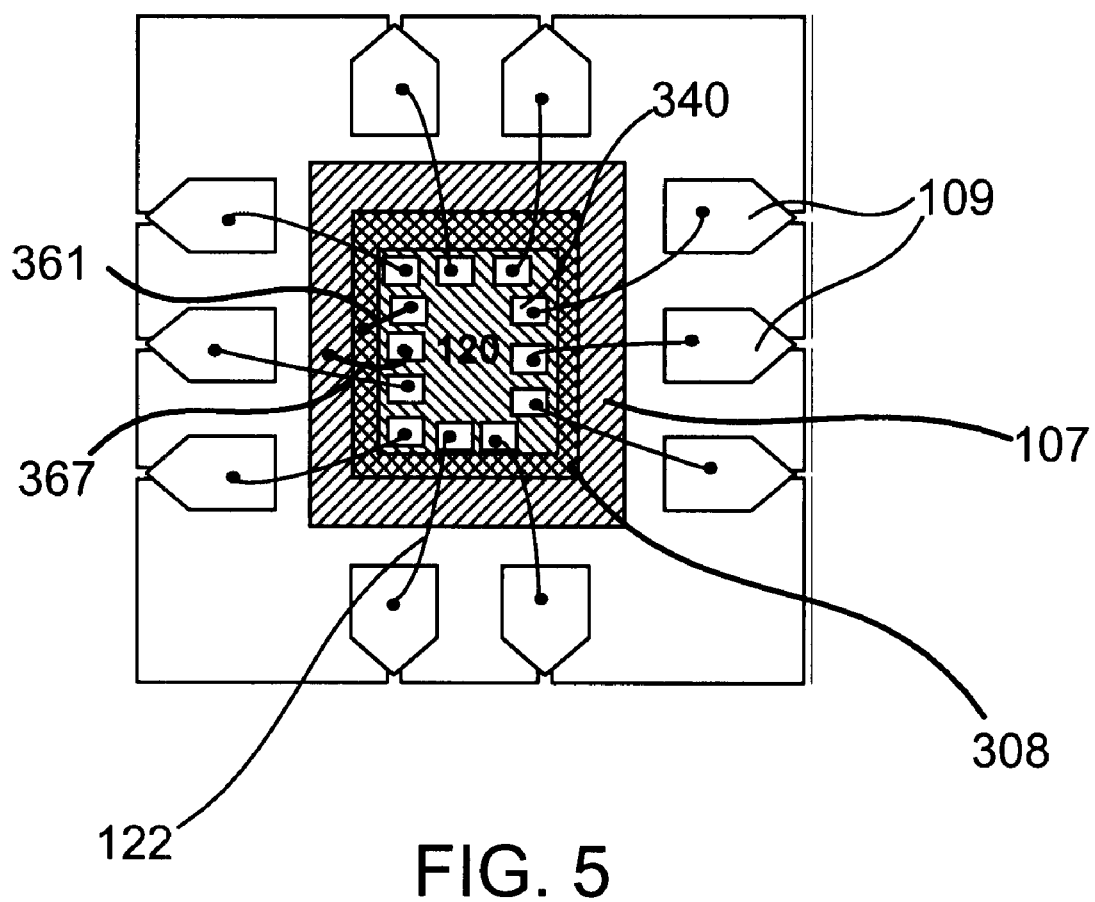
FIG. 5 is a top view of an alternative embodiment of the present invention with yet other alternative connections where the capacitor may be used for circuits in the IC die.

FIG. 5 illustrates another alternative embodiment of the present invention. In this embodiment, the capacitor is connected to circuits in the IC die. To connect the capacitor to circuits internal to die 120, die terminals 340 are directly down-bonded to the capacitor plates as exemplified by wires 361 and 367. It should be appreciated that the capacitor can instead be used externally, whereby the capacitor plates would be bonded to the IC package contacts for external connection.

The capacitor formed by each of the foregoing described structures has several degrees of freedom to adjust its effective capacitance value to a desired target. For example, the designer can reduce or increase the size of the plates to proportionally change the capacitance value of the integrated capacitor. Other variables to adjust in the parallel plate capacitor equation are the dielectric thickness and dielectric constant k. For current LLP configurations, a capacitance value of at least 0.001 $\mu F$ is achievable and desirable.

In the embodiments described above, the lower capacitor plate (substrate plate 107), is formed from the same sheet (lead frame) as the contacts 109. However, it should be appreciated that in alternative embodiments, the upper capacitor plate may be a die attach pad formed from the lead frame. In leadless configurations, the contacts may be downset relative to the die attach pad in order to permit the exposed lower capacitor plate to be substantially co-planar with the contacts. Alternatively, the exposed lower capacitor plate may be arranged to protrude below the surface of the contacts.

The principles of the present invention may also be applied to leaded package configurations having an exposed lower capacitor plate. By way of example, in a leaded configuration, a metal slug may be used as the exposed lower capacitor plate. The leads and the upper capacitor plate may then be formed from the lead frame. Such leaded packages may take any appropriate packaging configuration including QFP (quad flat packages), DIP (dual in-line packages), etc. Like the previously described embodiments, the capacitor structures in these devices may be wired in any suitable manner.

Figure 1B:
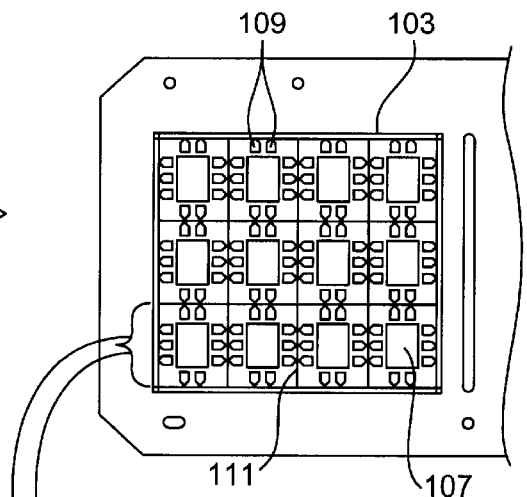
FIG. 1c is a single LLP element consisting of a substrate and contacts.
Figure 1C:
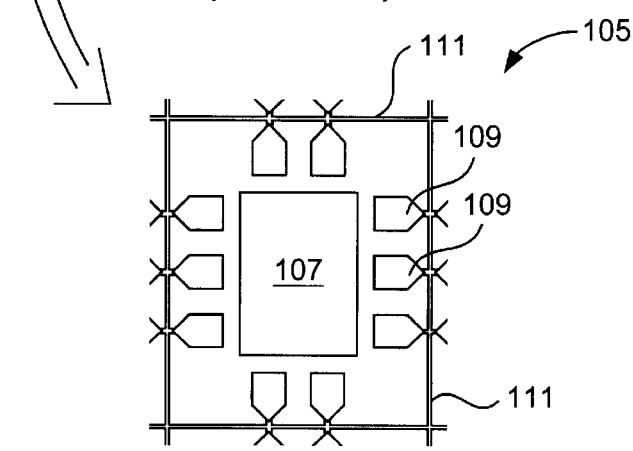
Figure 2:
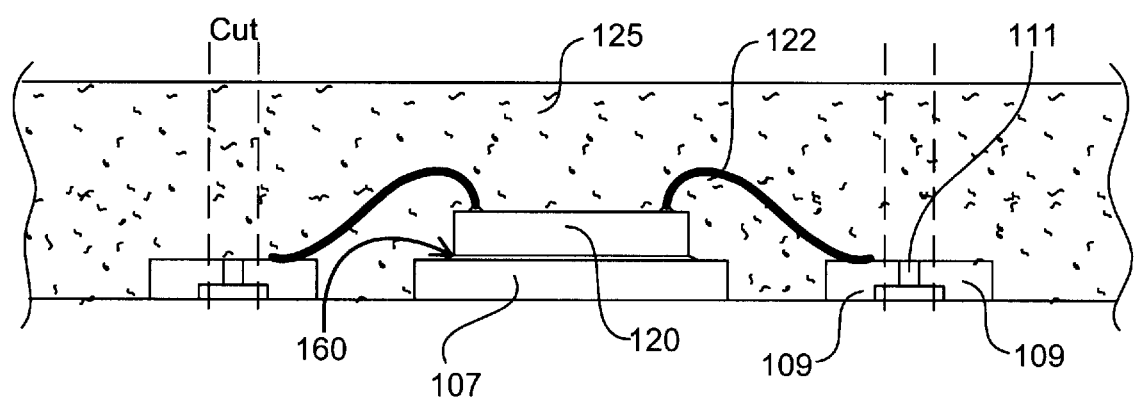
FIG. 2 is a diagrammatic cross sectional side view of a known LLP.
Figure 6:
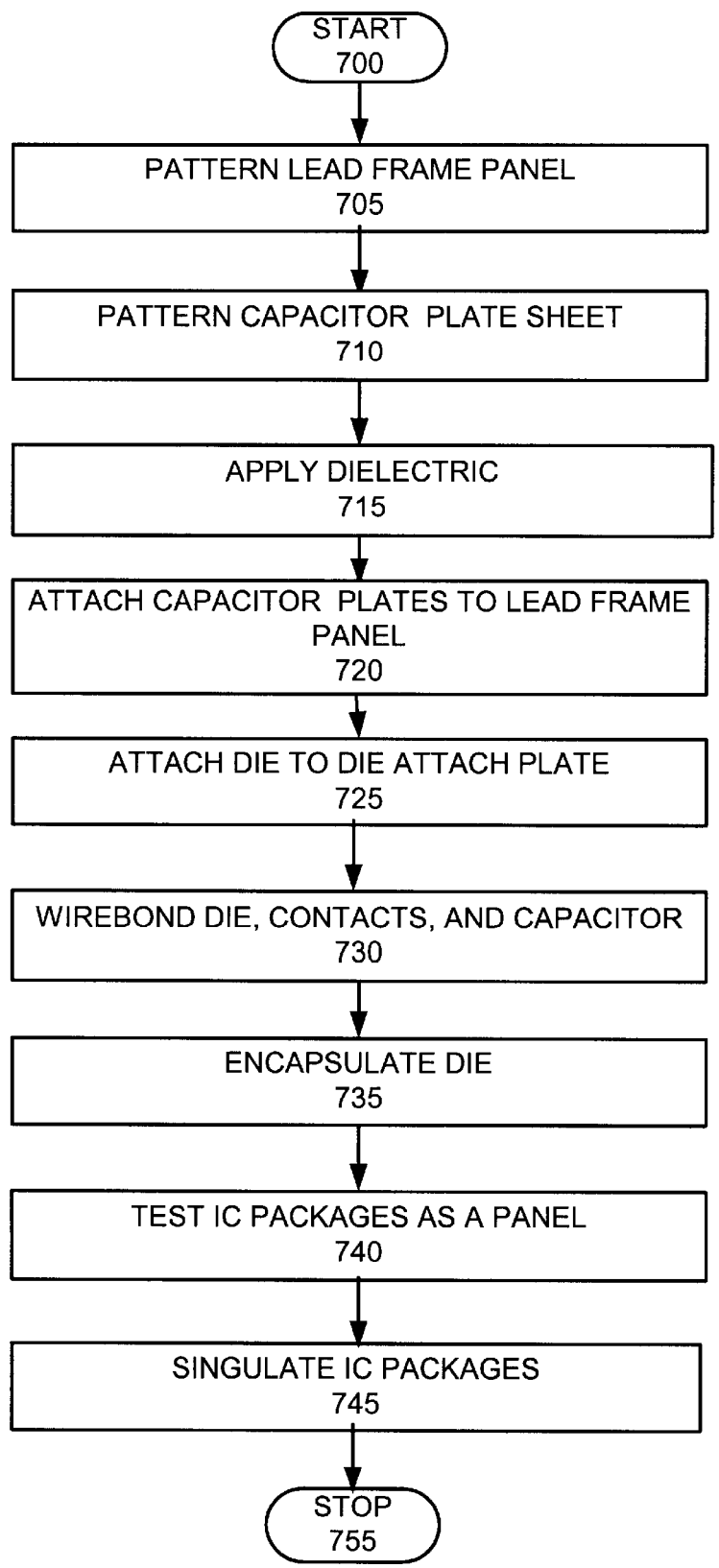
FIG. 6 illustrates process steps suitable to form an LLP embodiment of the present invention.
Figure 7A:
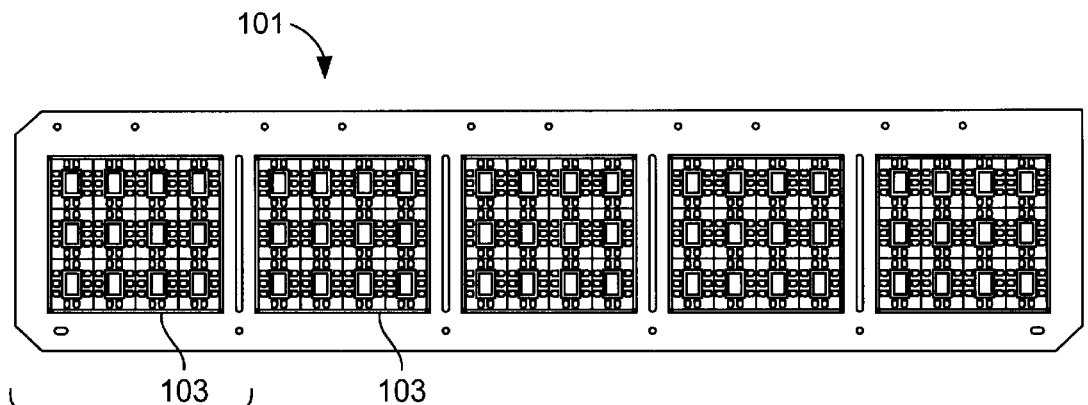
FIG. 7a is a diagrammatic top view of a lead frame strip suitable for use in forming the leadless packages of FIGS. 3(a) & (b).
Figure 7B:
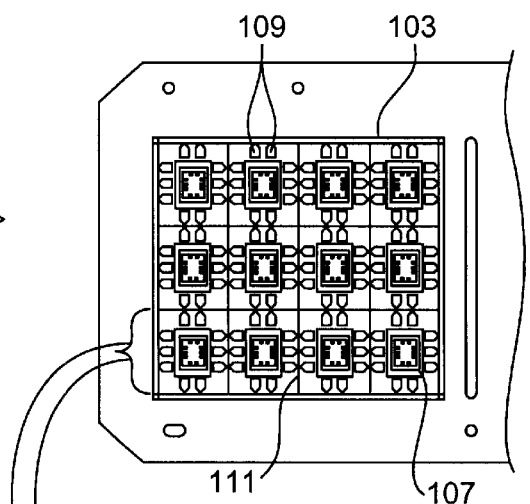
FIGS. 7b and 7c show successively more detailed views of the elements in the strip.
Figure 7C:
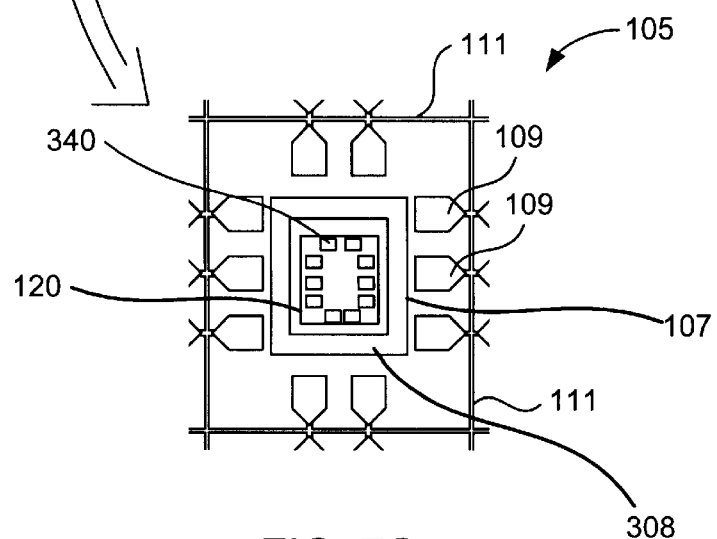

It should be appreciated that the described lead frame based capacitor structures can be created in strip or panel form and later singulated. One suitable panel based manufacturing approach suitable for forming the packages illustrated in FIG. 3 will be briefly described with reference to FIGS. 6 and 7. In this embodiment, a lead frame panel is patterned in a conventional manner as described above with reference to FIGS. 1a–c. (Step 705). The lead frame panel includes a plurality of two dimensional arrays of device areas that each include a substrate plate 107 and a plurality of contacts 109. A second metal sheet is patterned as a capacitor plate sheet that has a plurality of two dimensional arrays of die attach plates thereon. The die attach plates 308 are sized and positioned such that they will align with the substrate plates 107 on the lead frame panel. (Step 707). In Step 715 the dielectric is applied, by any appropriate technique, to one of the capacitor plates. By way of example, the dielectric could be a resin screened on by a mask, or a stamped adhesive tape. The capacitor plate sheet is then attached to the lead frame in step 720 with the die attach plates 308 aligned over their associated substrate plates 107, thus forming several arrays of capacitors.

After the capacitor structures have been formed, dice may be attached to the respective die attach plates (step 725) using conventional die attach techniques. Once the dice are in place they are electrically connected to the contacts 109 and the capacitor plates (step 730) using conventional techniques such as wire bonding. As discussed above, the electrical connections of the capacitor may vary significantly based on the particular design.

After the dice have been electrically connected, a cap is molded over each array. Step 735. In alternative embodiments, the dice can be individually molded. Thereafter the dice may be tested and singulated in step 740 and 745 respectively. It should be appreciated that the described steps are exemplary and that in several circumstances, the order of the various steps may be changed, some steps eliminated or combined and others added.

Although only a few embodiments of the present invention has been described in detail, it should be understood that the present invention may be embodied in many other specific forms without departing from the spirit or scope of the invention. Particularly, the exposed lead frame based capacitor structure can be applied to a variety of designs other than LLPs. For example, leaded packages such a quad flat packs (QFPs) and dual inline packages (DIPs) may incorporate the described capacitor structure. The materials used to form the capacitors as well as the sizes and configurations of the plates may be widely varied. In the illustrated embodiments, the die attach platform has been shown as having a smaller footprint than the substrate plate 107. This permits wire bonding to both capacitor plates (assuming the die attach platform is also sufficiently larger than the die). However, when there is no need to wire bond to the lower capacitor plate, the plates may be the same size, or if desired, the exposed plate may even have a smaller footprint. Therefore, the present examples are to be considered as illustrative and not restrictive, and the invention is not to be limited to the details given herein, but may be modified within the scope of the appended claims.

I claim:

1. An integrated circuit package comprising:
    a capacitor structure comprising first and second plates separated by a dielectric material wherein one of the capacitor plates is formed from the same sheet as the contacts;
    a die carried by the first capacitor plate;
    a plurality of contacts, wherein at least some of the contacts are electrically connected to the die; and
    an encapsulant that covers the die and a portion of the capacitor structure while leaving a surface of the second capacitor plate at least partially exposed.

2. An integrated circuit package as recited in claim 1 wherein the second capacitor plate is formed from the same sheet as the contacts and a surface of each contact is exposed and co-planar with the second capacitor plate forming sheet.

3. An integrated circuit package as recited in claim 1 wherein the first capacitor plate is formed from the same sheet as the contacts and a surface of each contact is exposed and co-planar with the first capacitor plate forming sheet.

4. An integrated circuit package as recited in claim 2 wherein the die has a multiplicity of bond pads and at least one of the bond pads is electrically connected to the first capacitor plate.

5. An integrated circuit package as recited in claim 2 wherein the die has a multiplicity of bond pads and at least one of the bond pads is electrically connected to the second capacitor plate.

6. An integrated circuit package as recited in claim 2 wherein at least one of the plurality of contacts is electrically connected to the first capacitor plate.

7. An integrated circuit package as recited in claim 2 wherein at least one of the plurality of contacts is electrically connected to the second capacitor plate.

8. An electronic module comprising a printed circuit board with power and ground connections and an integrated circuit package, the integrated circuit package including:
   a capacitor structure comprising first and second plates separated by a dielectric material wherein the second capacitor plate is electrically connected to one of the power and ground connections;
   a die carried by the first capacitor plate;
   a plurality of contacts, wherein at least some of the contacts are electrically connected to the die; and
   an encapsulant that covers the die and a portion of the capacitor structure while leaving a surface of the second capacitor plate at least partially exposed.

9. A panel assembly suitable for use in packaging a plurality of integrated circuits, the panel assembly comprising:
   a lead frame panel formed from a first conductive sheet, the lead frame panel being patterned to define a plurality of device areas, each device area being suitable for use as part of an independent integrated circuit package and including a plurality of contacts and a lead frame plate; and
   a second sheet of a conductive material patterned to form a plurality of plates that at least partially cover the lead frame panel with a dielectric material therebetween, thereby forming a plurality of capacitor structures, wherein each capacitor structure is associated with one of the device areas and includes an associated one of the lead frame plates and one of the plates from the second sheet.

10. A panel as recited in claim 9 further comprising:
   a plurality of integrated circuits mounted in associated device areas;
   a plurality of bonding wires that electrically interconnect I/O pads on the integrated circuits and contacts in the substrate panel and capacitor plates;
   an encapsulant that covers the integrated circuits and bonding wires and a portion of the capacitor structure while leaving a surface of the capacitor at least partially exposed.

* * * * *